US011655792B2

(12) United States Patent
Zhou (10) Patent No.: US 11,655,792 B2
(45) Date of Patent: May 23, 2023

(54) VOLTAGE SENSING MECHANISM (71) Applicant: Trillium Worldwide, Inc., Libertyville, IL (US)

(72) Inventor: Ai Wei Zhou, Huizhou (CN)

(73) Assignee: Trillium Worldwide, Inc., Libertyville, IL (US)

( * ) Notice: Subject to any disclaimer, the term of this patent is extended or adjusted under 35 U.S.C. 154(b) by 0 days.

(21) Appl. No.: 17/658,097

(22) Filed: Apr. 6, 2022

(65) Prior Publication Data

US 2022/0349372 A1 Nov. 3, 2022

Related U.S. Application Data (60) Provisional application No. 63/182,286, filed on Apr. 30, 2021.

(51) Int. Cl.
*G01R 19/165* (2006.01)
*G01R 1/02* (2006.01)
(Continued)

(52) U.S. Cl.
CPC ............. *F02P 17/12* (2013.01); *F23Q 23/08* (2013.01); *G01R 1/06777* (2013.01);
(Continued)

(58) Field of Classification Search
CPC .......... G01R 19/165; G01R 1/02; G01R 1/04; G01R 1/06; G01R 1/067; G01R 1/07; G01R 1/073
See application file for complete search history.

(56) References Cited

U.S. PATENT DOCUMENTS 3,315,163 A 4/1967 Lutz
4,121,068 A 10/1978 Peck
(Continued)

OTHER PUBLICATIONS

Description of YouTube video originally listed at URL: https://www.youtube.com/watch?v=x1phDFDc1HQ; retrieved on Apr. 19, 2021.
(Continued)

*Primary Examiner* — Neel D Shah
(74) *Attorney, Agent, or Firm* — McDonnell Boehnen Hulbert & Berghoff LLP (57) ABSTRACT

The present disclosure relates to voltage sensing mechanisms. One example embodiment includes a voltage-measurement device. The voltage-measurement device includes a housing. The voltage-measurement device also includes an extendible gripper configured to be removably attached to a wire under test. Additionally, the voltage-measurement device includes at least one power supply. Further, the voltage-measurement device includes a power management chip electrically coupled to the at least one power supply and configured to manage a range of input voltages from the at least one power supply. The power management chip comprises a synchronous boost voltage regulator. Additionally, the voltage-management device has a microprocessor electrically coupled to the power management chip and the extendible gripper. The microprocessor is configured to receive electrical power from the power management chip. The microprocessor is also configured to receive an electrical signal from the extendible gripper indicative of a voltage associated with the wire under test.

20 Claims, 2 Drawing Sheets

(51) Int. Cl.

| | | |
|---|---|---|
| *G01R 1/04* | (2006.01) | |
| *G01R 1/067* | (2006.01) | |
| *G01R 1/073* | (2006.01) | |
| *F02P 17/12* | (2006.01) | |
| *G01R 1/07* | (2006.01) | |
| *F23Q 23/08* | (2006.01) | |
| *H01T 13/58* | (2020.01) | |

(52) U.S. Cl.
CPC ........... *G01R 1/06788* (2013.01); *G01R 1/07* (2013.01); *G01R 19/16528* (2013.01); *G01R 19/16566* (2013.01); *H01T 13/58* (2013.01)

(56) References Cited

U.S. PATENT DOCUMENTS

| | | |
|---|---|---|
| 4,825,154 A | 4/1989 | Cross et al. |
| 5,607,436 A | 3/1997 | Pratt et al. |
| 5,670,762 A | 9/1997 | Futamura |
| 5,800,043 A | 9/1998 | Walkerow |
| 5,867,019 A | 2/1999 | Malenko et al. |
| 6,319,076 B1 | 11/2001 | Gollhofer et al. |
| 7,507,926 B2 | 3/2009 | Kawamura et al. |
| 7,710,237 B2 | 5/2010 | Kato |
| 7,753,918 B2 | 7/2010 | Hartley et al. |
| 8,602,125 B2 | 12/2013 | King |
| 8,917,084 B2 | 12/2014 | Konopka et al. |
| 2005/0189153 A1 | 9/2005 | Yang |
| 2013/0002239 A1* | 1/2013 | Konopka ................. G01R 1/07 324/149 |

OTHER PUBLICATIONS

Amazon Listing for "Check Spark Engine Ignition Analyzer"; originally made available on Jun. 20, 2011.
Brochure for Check Spark Model CS-2020; Apr. 2020.
User Guide for Check Spark Model CS-2020; 2013.

* cited by examiner

VOLTAGE SENSING MECHANISM

CROSS-REFERENCE TO RELATED APPLICATIONS

The present application is a non-provisional application that claims the benefit of U.S. Patent Application No. 63/182,286, filed Apr. 30, 2021, the contents of which are hereby incorporated by reference in their entirety. The present application also hereby incorporates U.S. Pat. No. 8,917,084 by reference in its entirety.

BACKGROUND

Unless otherwise indicated herein, the materials described in this section are not prior art to the claims in this application and are not admitted to be prior art by inclusion in this section.

It is often useful to detect whether sufficient voltage is currently present in a particular item, such as an insulated wire. For example, engine ignition analyzers are used to diagnose engine spark plugs that are defective or in need of replacement. Unfortunately, these existing engine ignition analyzers, as well as other types of voltage-detection devices, have several drawbacks, requiring a useful improvement. Most voltage-detection analyzers are powered using batteries. In addition, on-off switches are used in tandem with the battery in order to regulate when the power is permitted to flow. If the switch is in the "on" position, this indicates power is permitted to flow from the battery to the electrical components. If the switch is in the "off" position, this indicates that the flow of power from the battery is restricted, in which the electrical components do not receive power. The problem that occurs with such voltage detection analyzers is that an individual is very likely to leave the switch in the "on" position after using the device, unaware that the power is draining from the battery. Further, a problem with the aforementioned voltage analyzers, the engine ignition analyzers in particular, is that these require the spark plug to be disconnected, and the analyzer put in series with the high voltage cable, in order to be tested.

SUMMARY

The specification and drawings disclose embodiments that relate to voltage sensing mechanisms. Embodiments described herein may be usable to diagnose one or more problems associated with, for example, spark plugs and/or spark plug wires of an engine. The embodiments described herein may measure voltages associated with one or more spark plugs and then compare the measured voltages to one or more thresholds to determine the state of the given spark plug/associated wire.

In a first aspect, the disclosure describes a voltage-measurement device. The voltage-measurement device includes a housing. The voltage-measurement device also includes an extendible gripper configured to be removably attached to a wire under test. Additionally, the voltage-measurement device includes a chamber defined within the housing. The chamber is configured to contain at least one power supply. Further, the voltage-measurement device includes a printed circuit board at least partially disposed within the housing. The printed circuit board has, disposed thereon, one or more status light-emitting diodes (LEDs). The printed circuit board also has, disposed thereon, a power management chip electrically coupled to the at least one power supply and configured to manage a range of input voltages from the at least one power supply. The power management chip comprises a synchronous boost voltage regulator. Additionally, the printed circuit board has, disposed thereon, a microprocessor electrically coupled to the one or more status LEDs, the power management chip, and the extendible gripper. The microprocessor is configured to receive electrical power from the power management chip. The microprocessor is also configured to receive an electrical signal from the extendible gripper indicative of a voltage associated with the wire under test. Further, the microprocessor is configured to execute instructions stored on a non-transitory, computer-readable medium to determine the voltage associated with the wire under test based on the electrical signal; compare the determined voltage to one or more voltage thresholds to determine a status of the wire under test; and output the status of the wire under test using the one or more status LEDs.

The foregoing summary is illustrative only and is not intended to be in any way limiting. In addition to the illustrative aspects, embodiments, and features described above, further aspects, embodiments, and features will become apparent by reference to the figures and the following detailed description.

DETAILED DESCRIPTION

Example methods and systems are described herein. Any example embodiment or feature described herein is not necessarily to be construed as preferred or advantageous over other embodiments or features. The example embodiments described herein are not meant to be limiting. It will be readily understood that certain aspects of the disclosed systems and methods can be arranged and combined in a wide variety of different configurations, all of which are contemplated herein.

Furthermore, the particular arrangements shown in the figures should not be viewed as limiting. It should be understood that other embodiments might include more or less of each element shown in a given figure. In addition, some of the illustrated elements may be combined or omitted. Similarly, an example embodiment may include elements that are not illustrated in the figures.

While the term "voltage-measurement device" is used throughout this disclosure to describe embodiments capable of measuring electrical signals (e.g., associated with engine ignition systems), it is understood that other terms may be used interchangeably to describe the same embodiments. For example, the terms "voltage sensing mechanism," "voltage sensing device," "voltage-measurement mechanism," "electrical-measurement device," "electrical sensing mechanism," "electrical sensing device," "electrical-measurement mechanism," "signal-measurement device," "signal sensing mechanism," "signal-measurement mechanism," "signal sensing device," etc. may each be used to describe the embodiments contemplated herein.

I. OVERVIEW

Example embodiments relate to voltage sensing mechanisms. In order to diagnosis engine problems, it can be onerous if a mechanic needs to disassemble portions of the engine. Hence, it can be beneficial if a mechanic can determine the source of one or more problems without detaching or removing various components. In some cases, electrical issues can result in an engine malfunction. For example, spark plugs used for ignition may be faulty and/or the wires supplying electrical power to the spark plugs may be defective. Devices described herein may be used to diagnosis one or more defects with spark plugs and/or spark plug wiring without disconnecting the spark plug wires or removing the spark plug. While the embodiments described herein are described in the context of analyzing engines (in particular, spark plugs and spark plug wires of engines), it is understood that the embodiments are broadly applicable to voltage measurement and could be used to measure voltage across a wide variety of use cases, each of which is contemplated herein. Further, while example embodiments herein are referred to as "voltage-measurement devices" it is understood that other electrical measurements (e.g., current measurements) could likewise be made.

One example embodiment includes a device that can be removably attached to a wire under test. The wire under test may be configured, when operating properly, to supply the spark plug with electrical energy such that the spark plug can generate a spark (e.g., via dielectric breakdown between electrodes). For example, an example voltage-measurement device may include a hook, latch, clip, or other gripper that is attachable to the wire under test. Once the voltage-measurement device is attached to the wire under test, a technician (e.g., an auto-mechanic in the case of an automotive engine) may attempt to start the engine (e.g., by pulling a recoil starter, energizing an electric start for enough time so as to turn the engine over, etc.). A microprocessor of the voltage-measurement device may then receive an electrical signal (e.g., a voltage signal or a current signal) as a result of the attempted start (e.g., via the removably attached gripper). For example, an electrical signal may be imparted from the wire under test into the removably attached gripper and then transmitted from the removably attached gripper to the microprocessor.

Upon the microprocessor receiving the electrical signal, the microprocessor may determine a status associated the wire under test (e.g., a status of the wire itself, status of the corresponding spark plug, and/or status of the corresponding engine). The microprocessor may make such a determination by determining a value associated with the electrical signal (e.g., a voltage value) and comparing the determined value to one or more thresholds (e.g., by executing instructions stored in a non-transitory, computer-readable medium using one or more thresholds stored in the non-transitory, computer-readable medium). For example, if the determined value is less than a first threshold, the microprocessor may determine that the voltage of the electrical signal is low (e.g., corresponding to a short-circuited spark plug or a flooded engine). Additionally or alternatively, the microprocessor may determine that there is no voltage associated with the electrical signal (e.g., that no electrical signal was received at all). In such cases, the microprocessor may determine that the ignition is faulty. Further, if the determined value is greater than a second threshold, the microprocessor may determine that the voltage of the electrical signal is high (e.g., corresponding to an open-circuit, such as from a broken wire under test, and/or a faulty spark plug). If, however, the determined value is greater than the first threshold and lower than the second threshold, the microprocessor may determine that the voltage of the electrical signal is acceptable (e.g., corresponding to a firing spark plug).

Upon determining the status associated with the wire under test, the microprocessor may then output that status to be displayed to a technician. For example, the microprocessor may cause one or more status light-emitting diodes (LEDs) to illuminate based on the determined status. For example, the voltage-measurement device may include three status LEDs (e.g., of different colors): a first status LED corresponding to a low voltage, a second status LED corresponding to an acceptable voltage, and a third status LED corresponding to a high voltage. Based on the determined value associated with the wire under test, the microprocessor may cause a corresponding status LED to be illuminated. While status LEDs are described throughout, it is understood that other techniques for displaying the status associated with the wire under test are also usable and are contemplated herein. For example, a display (e.g., an LED-display, a liquid crystal display (LCD), a cathode-ray tube (CRT), etc.) may be included in the voltage-measurement device and used to indicate the status of the associated with the wire under test.

Based on the indications on the status LEDs (or other display), the technician may then take one or more remedial actions (e.g., repair and/or replace one or more components associated with the wire under test). For example, the technician may check or change fuel in the corresponding vehicle, check a choke setting of the corresponding engine, check or reset a kill switch of the corresponding vehicle, contact a manufacturer of the corresponding engine, replace a corresponding spark plug, wait to attempt to start a corresponding engine until it is no longer flooded, repair or replace the spark plug wire (e.g., the wire under test), reconnect the spark plug wire, etc.

II. EXAMPLE EMBODIMENTS

The following description and accompanying drawings will elucidate features of various example embodiments. The embodiments provided are by way of example, and are not intended to be limiting. As such, the dimensions of the drawings are not necessarily to scale.

Figure 1:
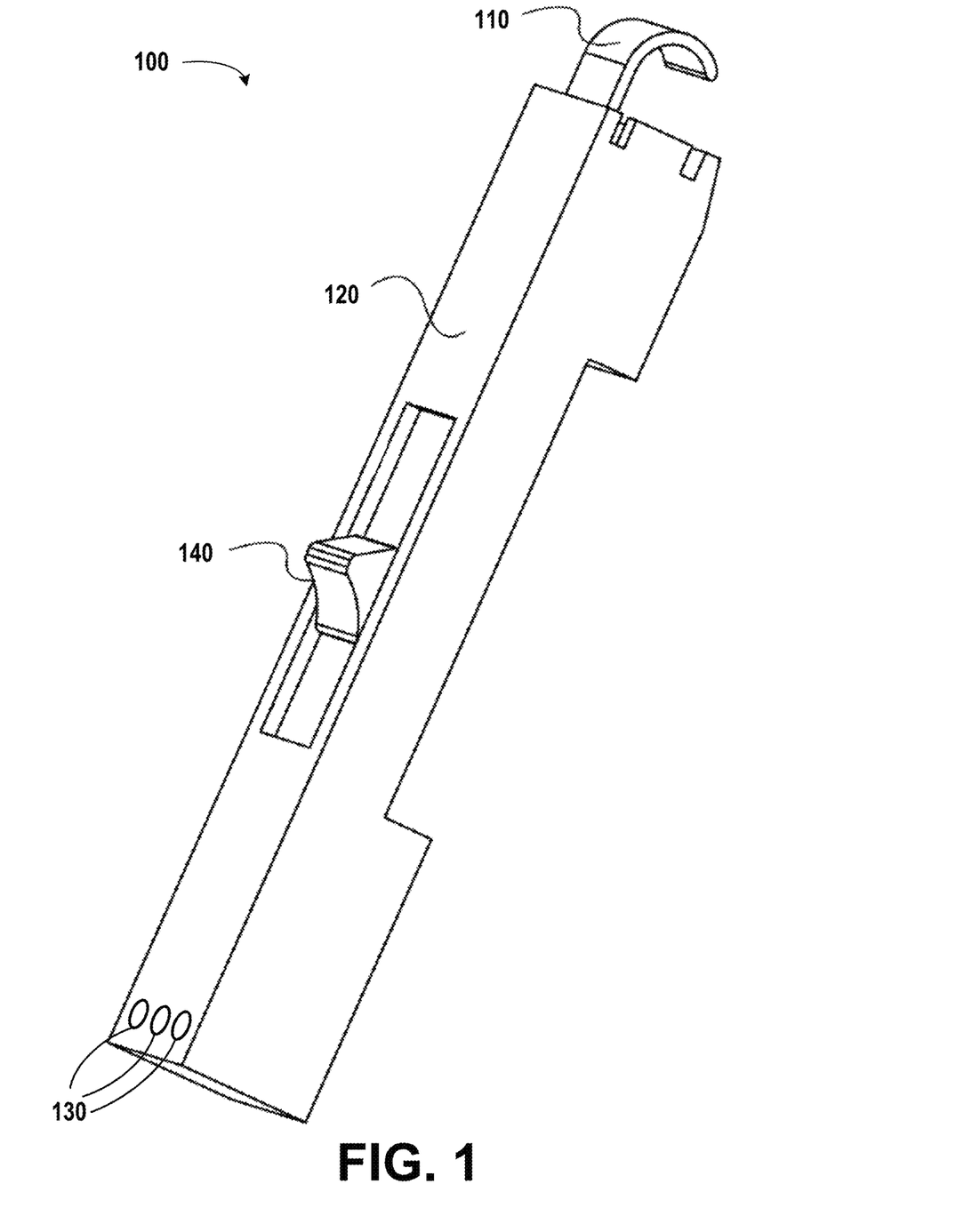
FIG. 1 is an illustration of a voltage-measurement device, according to example embodiments.

FIG. 1 is an illustration of a voltage-measurement device 100, according to example embodiments. In some embodiments, the voltage-measurement device 100 may configured to measure a voltage signal associated with an ignition system (e.g., that includes or does not include a capacitor discharge ignition (CDI)) in an engine (e.g., a two-stroke engine, a four-stroke engine, an engine using capacitor discharge ignition, an engine that does not use capacitor discharge ignition, a lawnmower engine, a tractor engine, a chain saw engine, a string trimmer engine, a lawn edger engine, a snow blower engine, a leaf blower engine, a pressure washer engine, a generator engine, a motorcycle engine, a snowmobile engine, an all-terrain vehicle engine, a personal watercraft engine, a boat engine, a go-cart engine, a golf cart engine, a moped engine, a car engine, a truck engine, or a jet engine). For example, the voltage-measurement device 100 may be used to diagnosis one or more issues associated with a spark plug and/or a spark plug wire.

The illustration of the voltage-measurement device 100 provided in FIG. 1 may correspond to an exterior of the voltage-measurement device 100, for example. As illustrated, the voltage-measurement device 100 may include an extendible gripper 110, a housing 120, one or more status LEDs 130, and a slider 140.

The extendible gripper 110 may be used to removably attach the voltage-measurement device 100 to a wire under test (e.g., an engine wire attached to a spark plug undergoing diagnostics). For example, the slider 140 may be connected to or integrated with the extendible gripper 110 and, therefore, may be usable to extend and/or retract the extendible gripper 110. Other mechanisms of manipulating the extendible gripper 110 are also possible and are contemplated herein. As illustrated, in some embodiments, the extendible gripper 110 may be in the shape of the hook (as illustrated in FIG. 1), such that the hook can be wrapped around the wire under test. Further, in some embodiments, the extendible gripper 110 may be spring-loaded (e.g., such that the extendible gripper 110 can remain removably attached to the wire under test without constant intervention by a mechanic). For example, the extendible gripper 110 may include an expansion spring (e.g., that generates a tension force when the extendible gripper 110 is extended using the slider 140). This may allow the extendible gripper 110 to automatically retract and, thereby, clamp onto the wire under test when an opposing force is not being applied to the slider 140.

The extendible gripper 110 may be made from a metal or other conductive material (e.g., such that the extendible gripper 110 can transmit an electrical signal from the wire under test to a microprocessor within the housing 120. In some embodiments, the extendible gripper 110 may include plastic. For example, the extendible gripper may have plastic integrated therein and/or may be partially or wholly encased within plastic. In this way, the durability of the extendible gripper 110 may be enhanced and/or outside electrical interference can be reduced. While the extendible gripper 110 is illustrated in FIG. 1 as a hook, it is understood that other shapes and/or sizes for the extendible gripper 110 are also possible and are contemplated herein. For example, the extendible gripper 110 may include a latch, clip, snap, loop, etc.

The housing 120 may be configured to contain or at least partially contain a number of components of the voltage-measurement device 100 (e.g., components shown and described with reference to FIG. 2). As such, the housing may prevent damage (e.g., both electrical and mechanical) to or interference (e.g., both electrical and mechanical) with one or more of the components inside the housing 120. The housing may be fabricated from plastic (e.g., injection-molded plastic) in some embodiments. In some embodiments, the housing may have one or more images or text printed thereon. For example, the housing may have a logo, a key (to be used to indicate the meaning of the status LEDs 130), instructions, labels (e.g., for component locations, such as a battery compartment), etc. printed thereon.

Although not immediately illustrated in FIG. 1, it is understood that, in some embodiments, the housing 120 may include one or more chambers defined therein. For example, the housing 120 may include a chamber configured to contain at least one power supply (e.g., a battery compartment). Such a chamber is illustrated in FIG. 2. Further, such a chamber may include one or more electrical couplings (e.g., to permit the power supply to supply electrical power to one or more components of the voltage-measurement device 100, such as a microprocessor).

Further, in some embodiments, the housing 120 may have, defined therein, one or more openings through which one or more wires could be electrically connected to one or more components on the interior of the housing 120. For example, the housing 120 may have an opening defined therein through which a charging cable can pass to charge the one or more power supplies of the voltage-measurement device 100. Additionally or alternatively, the housing 120 may have, defined therein, an opening through which a cable (e.g., a serial communication cable, such as a universal serial bus (USB) cable) can be electrically connected to a serial input port (e.g., the serial input port shown and described with reference to FIG. 2). Such an opening for a cable may be defined within a chamber configured to contain the at least one power supply. For example, the housing 120 may include a battery compartment and, behind where a battery is to be disposed, there may be located a serial communication port usable to communicatively couple a communication cable (e.g., connected to an external computing device) to a microprocessor. As such, the housing 120 may include an opening in the battery compartment for the cable to pass through to connect to the serial communication port.

As described above, the one or more power supplies (e.g., disposed within a chamber of the housing 120) may include one or more batteries. The batteries may be of various supply voltages and/or form factors. For example, the batteries could include D-cell batteries, C-cell batteries, A batteries, AA batteries, AAA batteries, etc. Additionally, the one or more batteries could include rechargeable and/or non-rechargeable batteries and various chemistries. For example, the one or more batteries may include a rechargeable Ni-MH battery (e.g., with a supply voltage of about 1.2 V), an alkaline battery (e.g., with a supply voltage of about 1.5 V), a carbon battery (e.g., with a supply voltage of about 1.5 V), a rechargeable lithium iron phosphate battery (e.g., with a supply voltage of about 3.2 V), or a rechargeable lithium-ion battery (e.g., with a supply voltage of about 3.6 V). Other battery form factors, supply voltages, and/or chemistries are also possible and contemplated herein. For example, the range of supply voltages acceptable by the voltage-measurement device 100 may be relatively large (e.g., between 1.2 V and 4.2 V). Further, it is noted that power supplies other than batteries and/or in addition to batteries are also possible and are contemplated herein. For example, the voltage-measurement device 100 may receive power directly from a wall outlet and/or from a USB cable. Other power supplies are also possible and are contemplated herein.

The status LEDs 130 may be used by the voltage-measurement device 100 (e.g., by a microprocessor of the voltage-measurement device 100) to display (e.g., to a user) one or more outputs (e.g., measurements) of the voltage-measurement device 100. In some embodiments, as illustrated, there may be three status LEDs 130. Further, though not illustrated in FIG. 1, in some embodiments, the status LEDs 130 may be labeled (e.g., by printing on the housing 120) to indicate the status indicated by the illumination of a respective status LED 130. For example, the status LEDs 130 may be labeled with "Low" (e.g., to indicate a low voltage status associated with the wire under test), "OK" (e.g., to indicate an acceptable voltage status associated with the wire under test), and "High" (e.g., to indicate a high voltage status associated with the wire under test). Further, to distinguish the status LEDs 130 from one another in some embodiments, the status LEDs 130 may be different colors. For instance, an "OK" status LED 130 may be green in color, whereas a "High" status LED 130 and a "Low" status LED 130 may be yellow in color. It is understood that in other embodiments other numbers and/or colors of status LEDs 130 are also possible and are contemplated herein. Further, other locations of the status LEDs 130 relative to the housing 120 of the voltage-measurement device 100 are also possible and contemplated herein.

In some embodiments, the status LEDs 130 may also flash (e.g., at a predetermined frequency or interval) to indicate a low input voltage associated with at least one power supply of the voltage-measurement device 100. For example, all three of the status LEDs 130 (or some other special combination of the LEDs) may flash when a battery of the voltage-measurement device 100 is running low (e.g., when the input voltage is below a threshold input voltage value). The frequency at which the status LEDs 130 flash and/or the order in which the status LEDs 130 flash (e.g., if the status LEDs 130 are flashed sequentially rather than simultaneously) may also indicate one or more statuses of the voltage-measurement device 100.

Although not illustrated in FIG. 1, in some embodiments, the voltage-measurement device 100 may include a selection mechanism (e.g., a switch, a slide, one or more buttons, etc.) that allows for a selection from among two or more engine types. For example, the engine-selection mechanism may allow for a selection between a two-stroke engine and a four-stroke engine or between smaller engines (e.g., lawn mower engine) and larger engines (e.g., automotive engine). Such a selection mechanism may be communicatively coupled to a printed circuit board and/or a microprocessor of the voltage-measurement device 100 to allow the microprocessor to receive a selection from the selection mechanism. Upon receiving the selection from the selection mechanism, the microprocessor may update one or more settings used for operation (e.g., thresholds used for comparisons to determine the status associated with a wire under test).

Figure 2:
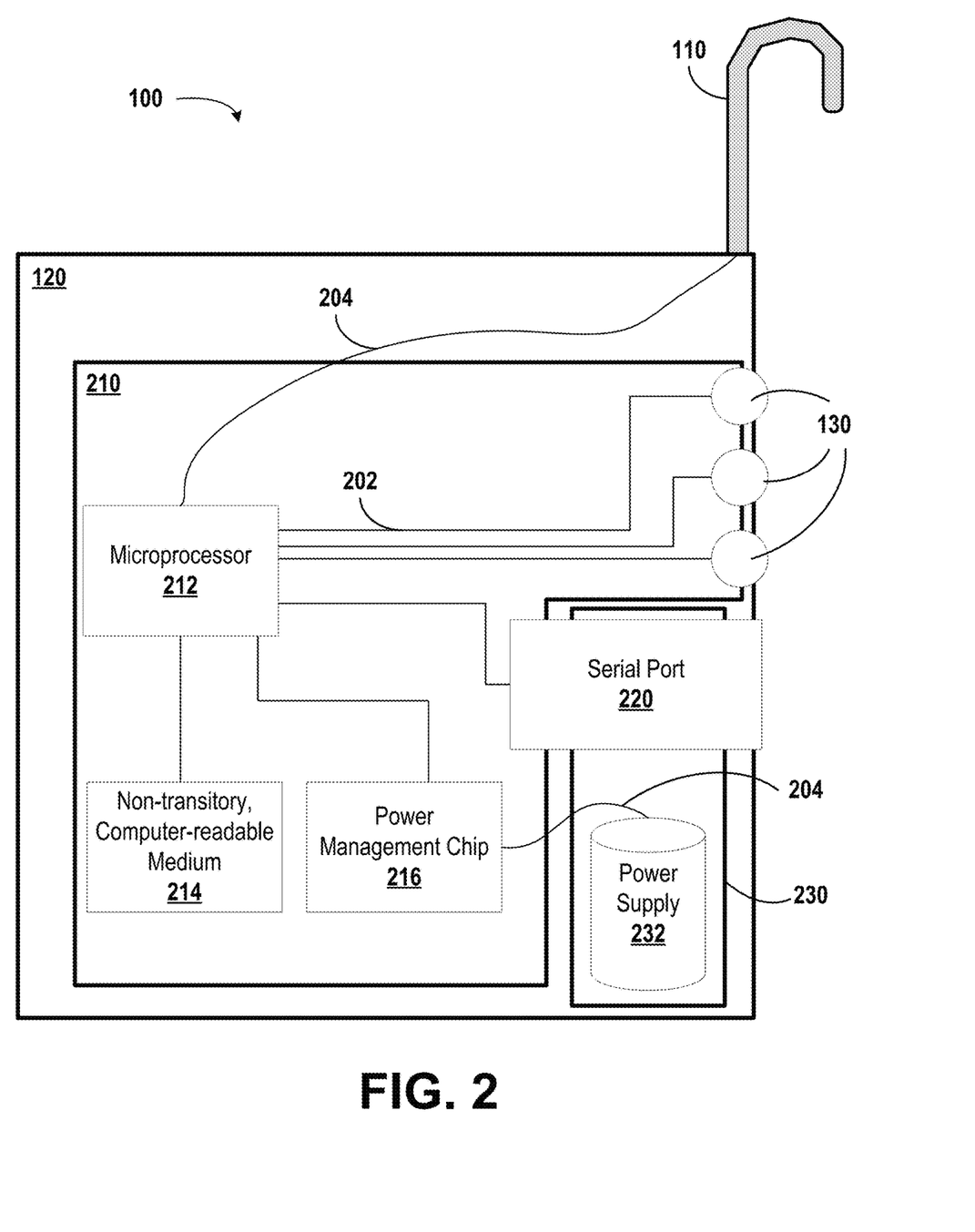
FIG. 2 is a schematic illustration of a voltage-measurement device, according to example embodiments.

FIG. 2 schematically illustrates the voltage-measurement device 100 (e.g., a cutaway view of the voltage-measurement device 100), according to example embodiments. As illustrated, the voltage-measurement device 100 may include the extendible gripper 110, the housing 120, and the status LEDs 130 illustrated in FIG. 1. Further, the voltage-measurement device 100 may include a printed circuit board (PCB) 210 inside the housing 120 and a chamber 230 defined within/by the housing 120. As illustrated, the extendible gripper 110 and the status LEDs 130 may extend, at least partially, outside the housing. Similarly, in embodiments having a serial port 220, the serial port may extend, at least partially, outside the housing. Further, as described above, the chamber 230 may be configured to house one or more power supplies 232 (e.g., batteries).

As illustrated, the PCB 210 may have, disposed thereon, the status LEDs 130, a microprocessor 212, a non-transitory, computer-readable medium 214, a power management chip 216, and a serial port 220. The serial port 220 may also be at least partially disposed within the chamber 230. Further, in some embodiments, one or more of the components disposed on the PCB 210 and/or the PCB 210 itself may be configured to withstand voltages (e.g., external voltages due to noise sources) up to 2,000 V. In addition, circuitry that connects the status LEDs 130, the microprocessor 212, the extendible gripper 110, and/or the power management chip 216 may be designed to prevent electrical interference (e.g., from external noise sources).

As illustrated, the components on the PCB 210 may be electrically connected by one or more conductive traces 202. For example, the microprocessor 212 may be coupled to each of the one or more status LEDs 130 (e.g., to cause the status LEDs 130 to illuminate), the serial port 220 (e.g., to receive configuration data from an external computing device via a communication cable), the non-transitory, computer-readable medium 214 (e.g., to store data for calculations by the microprocessor 212 and/or to access instructions for performing one or more functions associated with the voltage-measurement device 100), and the power management chip 216 (e.g., to receive electrical power for carrying out functions) using electrical traces 202. It is understood that other components may also be interconnected on the PCB 210 in more or alternate ways than those illustrated in FIG. 2 (e.g., the status LEDs 130 may be directly electrically connected to the power management chip 216).

As also illustrated, some of the components within the housing 120 may be connected to other components of the voltage-measurement device 100 using one or more wires 204. For example, the microprocessor 212 may be electrically connected to the extendible gripper 110 (e.g., to receive an electrical signal from the extendible gripper 110 that represents a current status of the wire under test) and the power management chip 216 may be coupled to the power supply 232 (e.g., to receive electrical power to be regulated and then supplied to the microprocessor 212) using wires 204. It is understood that one or more of the wires 204 may be coupled to one or more electrical traces 202 and/or replaced by one or more electrical traces 202 in alternate embodiments (e.g., depending on the internal electrical routing within the housing 120 and which components are located on the PCB 210). Likewise, it is understood that one or more of the electrical traces 202 may be replaced by one or more wires 204, in some embodiments (e.g., depending on the internal electrical routing within the housing 120 and which components are located on the PCB 210).

The microprocessor 212 may include one or more general-purpose processors and/or one or more special-purpose processors (e.g., application-specific integrated circuits (ASICs)). Further, the microprocessor 212 may receive electrical power from the power management chip 216. Additionally, the microprocessor 212 may carry out instructions (e.g., compiled or non-compiled program logic and/or machine code) stored within the non-transitory, computer-readable medium 214 (e.g., to receive, analyze, and output voltage signals associated with the wire under test). For example, the microprocessor 212 may perform a variety of functions by executing the instructions stored within the non-transitory, computer-readable medium 214, such as determining the voltage associated with the wire under test based on an electrical signal received from the extendible gripper 110, comparing the determined voltage to one or more voltage thresholds (e.g., as stored within the non-transitory, computer-readable medium 214) to determine a status of the wire under test, outputting the status of the wire under test using the one or more status LEDs 130, causing the one or more status LEDs to repeatedly flash when an input voltage associated with the power supply 232 and/or the power management chip 216 is below a threshold input voltage value (e.g., as stored within the non-transitory, computer-readable medium 214), powering down the voltage-measurement device 100 after a specified duration of inactivity (e.g., to conserve power stored within the power supply 232), modify instructions stored on the non-transitory, computer-readable medium 214 based on one or more electrical signals transmitted to the voltage-measurement device 100 via a cable connected to the serial port 220. Modifying instructions stored on the non-transitory, computer-readable medium 214 may include updating one or more settings of the voltage-measurement device 100 (e.g., updating one or more voltage thresholds, updating a frequency at which the one or more status LEDs 130 flash to indicate low input voltage associated with the power supply 232, updating which of the one or more status LEDs 130 flash to indicate low input voltage associated with the power supply 232).

The non-transitory, computer-readable medium 214 may include one or more volatile and/or non-volatile memories. For example, the non-transitory, computer-readable medium 214 may include a random-access memory (RAM), a read-only memory (ROM), etc. In some embodiments, the non-transitory, computer-readable medium 214 may be partially or wholly integrated with the microprocessor 212 (e.g., a level 1 (L1) cache or a level 2 (L2) cache within the microprocessor 212). The non-transitory, computer-readable medium 214 may include removable components (e.g., a flash drive) and/or non-removable components (e.g., a ROM attached to a motherboard).

The power management chip 216 may be configured to take the supplied electrical power (e.g., from the power supply 232) and convert it into a power signal usable by other components of the voltage-measurement device 100 (e.g., the microprocessor 212). For example, the power management chip 216 may rectify, up-convert, down-convert, invert, etc. the supplied electrical power from the power supply 232 before passing that signal to the microprocessor 212. In some embodiments, the power management chip 216 may manage a range of input voltages from the power supply 232. For example, the power management chip 216 may convert an input voltage from the power supply 232 to a voltage that is usable by the microprocessor 212 (e.g., so as not to underpower the microprocessor 212 or destroy the microprocessor 212 with excess voltage). In some embodiments, the power management chip 216 may include a synchronous boost voltage regulator. As such, the power management chip 216 may have an electrical conversion efficiency of between 90% and 94% (e.g., 93%), which may be higher than embodiments using an asynchronous boost voltage regulator (e.g., due to higher conduction speed and smaller conduction voltage drop). In addition, synchronous boost voltage regulators may not require external diodes to function (e.g., thereby increasing the electrical conversion efficiency). Further, the power management chip 216 may accept a range of input voltages between 1.2 V and 4.2 V.

The serial port 220 may allow for an external cable to be connected to the voltage-measurement device 100 (e.g., to transmit an electrical signal to the microprocessor 212). In some embodiments, for example, the external cable may be a USB cable and the serial port 220 may be a USB port. However, other types of serial ports 220 are also possible and are contemplated herein (e.g., a port having four pins, one corresponding to $V_{DD}$, one corresponding to $R_X$, one corresponding to $T_X$, and one corresponding to $V_{SS}$) to transmit signals between an attached cable and the microprocessor 212. An external cable connected to the serial port 220 may be connected at an opposite end to another computing device (e.g., a personal computing device, a laptop computing device, a tablet computing device, etc.). The other computing device may execute instructions (e.g., a voltage-measurement device 100 management software, which may itself be retrievable over a network, such as the public internet) configured to transmit electrical signals to the voltage-measurement device 100 over the cable that are usable by the voltage-measurement device 100 (e.g., by the microprocessor 212) to update data (e.g., settings) and/or instructions stored within the non-transitory, computer-readable medium 214 (e.g., to update a firmware of the voltage-measurement device 100). Such an interaction may occur using a serial data cable driver.

III. CONCLUSION

The present disclosure is not to be limited in terms of the particular embodiments described in this application, which are intended as illustrations of various aspects. Many modifications and variations can be made without departing from its scope, as will be apparent to those skilled in the art. Functionally equivalent methods and apparatuses within the scope of the disclosure, in addition to those described herein, will be apparent to those skilled in the art from the foregoing descriptions. Such modifications and variations are intended to fall within the scope of the appended claims.

The above detailed description describes various features and operations of the disclosed systems, devices, and methods with reference to the accompanying figures. The example embodiments described herein and in the figures are not meant to be limiting. Other embodiments can be utilized, and other changes can be made, without departing from the scope of the subject matter presented herein. It will be readily understood that the aspects of the present disclosure, as generally described herein, and illustrated in the figures, can be arranged, substituted, combined, separated, and designed in a wide variety of different configurations.

With respect to any or all of the message flow diagrams, scenarios, and flow charts in the figures and as discussed herein, each step, block, operation, and/or communication can represent a processing of information and/or a transmission of information in accordance with example embodiments. Alternative embodiments are included within the scope of these example embodiments. In these alternative embodiments, for example, operations described as steps, blocks, transmissions, communications, requests, responses, and/or messages can be executed out of order from that shown or discussed, including substantially concurrently or in reverse order, depending on the functionality involved. Further, more or fewer blocks and/or operations can be used with any of the message flow diagrams, scenarios, and flow charts discussed herein, and these message flow diagrams, scenarios, and flow charts can be combined with one another, in part or in whole.

A step, block, or operation that represents a processing of information can correspond to circuitry that can be configured to perform the specific logical functions of a herein-described method or technique. Alternatively or additionally, a step or block that represents a processing of information can correspond to a module, a segment, or a portion of program code (including related data). The program code can include one or more instructions executable by a processor for implementing specific logical operations or actions in the method or technique. The program code and/or related data can be stored on any type of computer-readable medium such as a storage device including RAM, a disk drive, a solid state drive, or another storage medium.

The computer-readable medium can also include non-transitory computer-readable media such as computer-readable media that store data for short periods of time like register memory and processor cache. The computer-readable media can further include non-transitory computer-readable media that store program code and/or data for longer periods of time. Thus, the computer-readable media may include secondary or persistent long term storage, like ROM, optical or magnetic disks, solid state drives, compact-disc read only memory (CD-ROM), for example. The computer-readable media can also be any other volatile or non-volatile storage systems. A computer-readable medium can be considered a computer-readable storage medium, for example, or a tangible storage device.

Moreover, a step, block, or operation that represents one or more information transmissions can correspond to information transmissions between software and/or hardware modules in the same physical device. However, other information transmissions can be between software modules and/or hardware modules in different physical devices.

The particular arrangements shown in the figures should not be viewed as limiting. It should be understood that other embodiments can include more or less of each element shown in a given figure. Further, some of the illustrated elements can be combined or omitted. Yet further, an example embodiment can include elements that are not illustrated in the figures.

While various aspects and embodiments have been disclosed herein, other aspects and embodiments will be apparent to those skilled in the art. The various aspects and embodiments disclosed herein are for purpose of illustration and are not intended to be limiting, with the true scope being indicated by the following claims.

What is claimed:

1. A voltage-measurement device:
a housing;
an extendible gripper configured to be removably attached to a wire under test;
a chamber defined within the housing, wherein the chamber is configured to contain at least one power supply; and
a printed circuit board at least partially disposed within the housing, wherein the printed circuit board has, disposed thereon:
one or more status light-emitting diodes (LEDs);
a power management chip electrically coupled to the at least one power supply and configured to manage a range of input voltages from the at least one power supply, wherein the power management chip comprises a synchronous boost voltage regulator; and
a microprocessor electrically coupled to the one or more status LEDs, the power management chip, and the extendible gripper, wherein the microprocessor is configured to:
receive electrical power from the power management chip;
receive an electrical signal from the extendible gripper indicative of a voltage associated with the wire under test; and
execute instructions stored on a non-transitory, computer-readable medium to:
determine the voltage associated with the wire under test based on the electrical signal;
compare the determined voltage to one or more voltage thresholds to determine a status of the wire under test; and
output the status of the wire under test using the one or more status LEDs.

2. The voltage-measurement device of claim 1, wherein the microprocessor is further configured to execute instructions stored on a non-transitory, computer-readable medium to cause the one or more status LEDs to repeatedly flash when an input voltage associated with the at least one power supply is below a threshold input voltage value.

3. The voltage-measurement device of claim 2, wherein the threshold input voltage value is about 1.2 V.

4. The voltage-measurement device of claim 2, wherein the one or more status LEDs comprise three status LEDs, and wherein causing the one or more status LEDs to repeatedly flash comprises causing the three status LEDs to flash substantially simultaneously at repeated intervals.

5. The voltage-measurement device of claim 1, wherein the one or more status LEDs comprise:
a first status LED configured to indicate when the status of the wire under test corresponds to a low voltage;
a second status LED configured to indicate when the status of the wire under test corresponds to an acceptable voltage; and
a third status LED configured to indicate when the status of the wire under test corresponds to a high voltage.

6. The voltage-measurement device of claim 1, wherein an electrical conversion efficiency of the power management chip is between 90% and 94%.

7. The voltage-measurement device of claim 1, wherein the range of input voltages managed by the power management chip is between 1.2 V and 4.2 V.

8. The voltage-measurement device of claim 1, wherein the extendible gripper comprises plastic or is encased, at least partially, within plastic.

9. The voltage-measurement device of claim 1,
wherein the printed circuit board comprises one or more components configured to withstand voltages up to 2,000 V, and
wherein a circuit that couples the one or more status LEDs, the power management chip, the extendible gripper, and the microprocessor is designed to prevent electrical interference.

10. The voltage-measurement device of claim 1,
wherein the printed circuit board further has, disposed thereon, an input serial port electrically coupled to the microprocessor,
wherein the housing has, defined therein, an opening through which a cable can be electrically connected to the input serial port,
wherein the microprocessor is further configured to receive updates used to modify the instructions stored on the non-transitory, computer-readable medium through one or more electrical signals transmitted via the cable, and
wherein the updates are usable to modify the instructions to change one or more settings of the voltage-measurement device.

11. The voltage-measurement device of claim 10, wherein the opening through which the cable can be electrically connected to the input serial port is defined within the chamber configured to contain the at least one power supply.

12. The voltage-measurement device of claim 10, wherein the one or more settings of the voltage-measurement device comprise the one or more voltage thresholds.

13. The voltage-measurement device of claim 10, wherein the one or more settings of the voltage-measurement device comprise a frequency at which the one or more status LEDs flash to indicate low input voltage associated with the at least one power supply or which of the one or more status LEDs flash to indicate low input voltage associated with the at least one power supply.

14. The voltage-measurement device of claim 1, wherein the at least one power supply comprises a rechargeable Ni-MH battery, an alkaline battery, a carbon battery, a rechargeable lithium iron phosphate battery, or a rechargeable lithium-ion battery.

15. The voltage-measurement device of claim 1,
wherein wire under test is attached to a spark plug in an engine, and
wherein the status of the wire under test comprises a proper spark status, a shorted circuit/fouled spark plug status, or an open circuit/broken spark plug wires status.

16. The voltage-measurement device of claim 15, wherein the engine is a two-stroke engine, a four-stroke engine, an engine using capacitor discharge ignition, an engine that does not use capacitor discharge ignition, a lawnmower engine, a tractor engine, a chain saw engine, a string trimmer engine, a lawn edger engine, a snow blower engine, a leaf blower engine, a pressure washer engine, a generator engine, a motorcycle engine, a snowmobile engine, an all-terrain vehicle engine, a personal watercraft engine, a boat engine, a go-cart engine, a golf cart engine, a moped engine, a car engine, a truck engine, or a jet engine.

17. The voltage-measurement device of claim 1, wherein the microprocessor is further configured to execute the instructions stored on the non-transitory, computer-readable medium to power down after a specified duration of inactivity.

18. The voltage-measurement device of claim 1, wherein the extendible gripper is spring-loaded such that the extendible gripper can grip the wire under test.

19. The voltage-measurement device of claim 18, wherein the extendible gripper comprises an expansion spring.

20. The voltage-measurement device of claim 1, wherein the extendible gripper comprises a hook.

\* \* \* \* \*